United States Patent [19]

Adachi

[11] Patent Number: 5,416,366
[45] Date of Patent: May 16, 1995

[54] SEMICONDUCTOR INTEGRATED CIRCUIT DEVICE

[75] Inventor: Yukinobu Adachi, Hyogo, Japan

[73] Assignee: Mitsubishi Denki Kabushiki Kaisha, Tokyo, Japan

[21] Appl. No.: 971,186

[22] Filed: Nov. 3, 1992

[30] Foreign Application Priority Data

Nov. 6, 1991 [JP] Japan .................................. 3-290183

[51] Int. Cl.6 ................ H03K 19/0948; H03K 19/003
[52] U.S. Cl. ........................................ 326/33; 326/121
[58] Field of Search ...................... 307/451, 443, 296.8, 307/362, 296.5

[56] References Cited

U.S. PATENT DOCUMENTS

| | | | |
|---|---|---|---|
| 4,410,813 | 10/1983 | Barker et al. | 307/296.8 |
| 4,595,844 | 6/1986 | Shen | 307/296.5 |
| 4,929,853 | 5/1990 | Kim et al. | 307/451 |
| 4,964,084 | 10/1990 | Jung et al. | 307/296.8 |
| 5,041,741 | 8/1991 | Steele | 307/451 |

FOREIGN PATENT DOCUMENTS

4004381A1 1/1991 Germany .

Primary Examiner—Edward P. Westin
Assistant Examiner—Jon Santamauro
Attorney, Agent, or Firm—Lowe, Price, LeBlanc & Becker

[57] ABSTRACT

Fluctuation of the minimum voltage value allowing determination of the "H" level of an input signal and of maximum voltage value allowing determination of the "L" level of the input signal dependent on the supply voltage is suppressed, in order to enlarge operation margin. A semiconductor integrated circuit device includes a P channel transistor and an N channel transistor constituting a CMOS inverter, an N channel transistor connected in parallel to N channel transistor, and a plurality of N channel transistors for applying a voltage provided by lowering the supply voltage to the gate electrode of N channel transistor, in which a plurality of N channel transistor are connected in series.

8 Claims, 3 Drawing Sheets

SEMICONDUCTOR INTEGRATED CIRCUIT DEVICE

BACKGROUND OF THE INVENTION

1. Field of the Invention

The present invention relates to a semiconductor integrated circuit device employing a inverter, and more specifically, to an inverter at an initial stage of input.

2. Description of the Background Art

A semiconductor integrated circuit device such as a semiconductor memory device and a microcomputer includes various logic circuits. These logic circuits have different operation voltages and different values of logic amplitude. For this reason, an inverter having wide operation margin is required as an inverter at the initial stage.

FIG. 5 is a block diagram showing an input portion of a dynamic random access memory (hereinafter referred to as a DRAM) for explaining the background of the invention. Referring to FIG. 5, the input portion of the DRAM includes external terminals ext. $\overline{RAS}$, ext. $\overline{CAS}$, ext. $\overline{W}$, ext. Add, ext. $\overline{R}$, Din and Vcc and a plurality of input buffer circuits 100.

A row address strobe signal is input through the external terminal ext. $\overline{RAS}$.

A column address strobe signal is input through the external terminal ext. $\overline{CAS}$.

A write control signal is input through the external terminal ext. $\overline{W}$.

Row and column address signals for selecting a row and a column of the memory cell array, not shown, are input through the external terminal ext. Add.

External data is input through the external terminal Din.

The input buffer circuits 100 are connected to corresponding external terminals and convert the external signals to internal signals int. RAS, int. CAS, int. W, int. Add, int. R, and int. Din.

In operation, the input buffer circuit 100 detects an external signal input through the external terminal, and outputs an internal signal whose logical amplitude is limited by the supply voltage Vcc and the ground potential. In this manner, the internal signals are adapted to have sufficient level to drive or control the row decoder, column decoder, write/read control circuit (not shown) of the DRAM, enabling accessing operation of the DRAM.

In order to realize the aforementioned levels of the internal signals, a CMOS inverter such as shown in FIG. 6 is generally used.

FIG. 6 is a schematic diagram showing a semiconductor integrated circuit device employing a conventional CMOS inverter without taking into consideration the operation margin.

Referring to FIG. 6, the semiconductor integrated circuit device includes P channel transistors 1a and 4a, and N channel transistors 1b and 4b. P channel transistor 1a and N channel transistor 1b are complementarily connected to form a CMOS inverter. More specifically, the gate electrodes are commonly connected to an input node N1 to receive an input signal, and the drain electrodes are commonly connected to an output node N2. The source electrode of P channel transistor 1a is connected to the supply voltage Vcc, and the source electrode of N channel transistor 1b is connected to the ground potential. P channel transistor 4a and N channel transistor 4b are also complimentarily connected as in the case of P channel transistor 1a and N channel transistor 1b. The gate electrodes of P channel transistor 4a and N channel transistor 4b are commonly connected to an input node N3, and the drain electrodes are connected to an output node N4. The output node N4 is connected to a load of a succeeding stage.

In operation, when an input signal is at the "H" (high) level, P channel transistor 1a turns off, N channel transistor 1b turns on, and an output of "L" (low) level is provided from output node N2. In response, P channel transistor 4a of the next stage turns on, and N channel transistor 4b turns off. Consequently, an output of "H" level is provided from output node N4. On the other hand, when the input signal is at the "L" level, P channel transistor 1a turns on, N channel transistor 1b turns off, and an output of "H" level is provided from output node N2. In response, P channel transistor 4a of the next stage turns off, and N channel transistor 4b turns on. Thus an output of "L" level is provided from output node N4.

In the above described switching operation, the minimum voltage value (hereinafter referred to as $V_{IH}$min) enabling determination of the input signal as "H" level is determined dependent on the ratio of the sizes of P channel transistor 1a and N channel transistor 1b constituting the CMOS inverter of the initial stage. Therefore, $V_{IH}$min generally depends on the supply voltage. As a result, the higher the supply voltage is, the higher $V_{IH}$min becomes, and the smaller the margin becomes. It is determined as a specification that semiconductor integrated circuits operate normally in the range of ±10% of rated voltage Vcc=5 V.

The maximum voltage value (hereinafter referred to as $V_{IL}$max) enabling determination of the input signal as "L" is similarly depends on the supply voltage Vcc. Therefore, the lower the supply voltage is, the smaller $V_{IL}$max becomes, and the smaller the margin becomes.

As described above, the conventional semiconductor integrated circuit device has a problem that the margins of $V_{IH}$min and $V_{IL}$max become smaller dependent on variation of the supply voltage.

If the ratio of the sizes of P channel transistor 1a and N channel transistor 1b constituting the CMOS inverter is changed to enlarge the margin of $V_{IH}$min, the margin of $V_{IL}$max become smaller. On the contrary, if the margin for $V_{IL}$max is to be enlarged, the margin for $V_{IH}$min becomes smaller.

Thus, the operation margin cannot be sufficiently improved simply by changing the ratio of the sizes of P channel transistor and N channel transistor constituting the CMOS inverter.

If the operation margin is small and the input voltage includes noise, determination as to whether the input signal is at the high level or low level is delayed, which possibly causes malfunction in a semiconductor memory device or in a digital semiconductor integrated circuit such as a micro-computer.

SUMMARY OF THE INVENTION

An object of the present invention is to suppress, in a semiconductor integrated circuit device, variation of values of $V_{IH}$min and $V_{IL}$max regardless of the variation of supply voltages, and to sufficiently enlarge operation margins of these values.

Another object of the present invention is to enlarge operation margin by a simple circuit structure.

Briefly stated, the semiconductor integrated circuit device in accordance with the present invention includes a CMOS inverter having series connected first and second field effect elements of different types of conductivity, a third field effect element, and a control element.

The third field effect element has the same conductivity type as the first field effect transistor, and is connected in parallel to the first field effect transistor.

The control element generates a voltage provided by lowering, and supplies lowered supply voltage to the third field effect element for controlling conductivity thereof.

In operation, the higher the supply voltage becomes, the higher the voltage generated by the control element becomes, and the capability of current supply of the third field effect element is increased. Consequently, current flows more easily in the first and third field effect elements which are connected in parallel, compared with the second field effect element. As a result, the value $V_{IH}min$ become lower and dependency on voltage of $V_{IH}min$ is suppressed, so that the margin is enlarged.

Conversely, when the supply voltage becomes lower, the voltage generated by the control element becomes lower, and the capability of current supply of the third field effect element is decreased. Consequently, compared with the case where the supply voltage becomes higher, current flows more easily in the second field effect element as compared with the first and third field effect elements which are connected in parallel. Consequently, the value $V_{IL}max$ becomes higher, the dependency on voltage of $V_{IL}max$ is suppressed, and the margin is enlarged.

According to the present invention, by a simple structure including a field effect element connected in parallel to one of the field effect elements constituting a CMOS inverter and in which the parallel-connected field effect element is controlled by a voltage provided by lowering the supply voltage by a prescribed amount, the dependency on voltage of the values $V_{IH}min$ and $V_{IL}max$ can be suppressed, and the operation margins can be enlarged.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
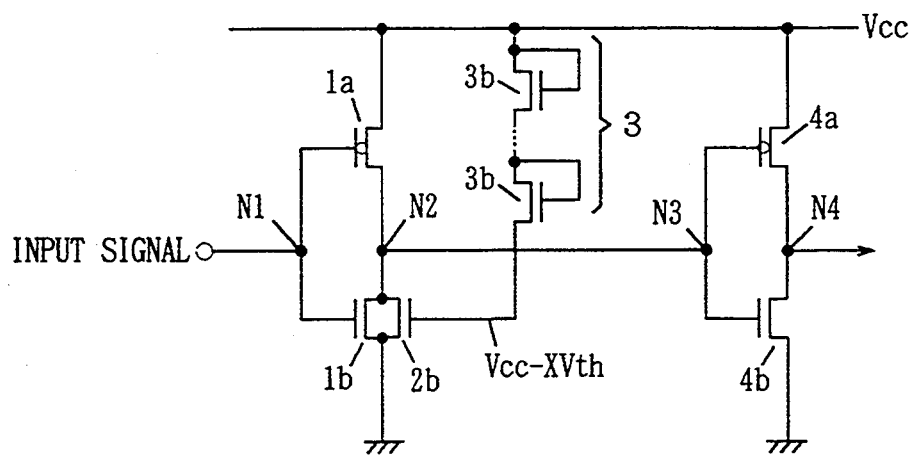
FIG. 1 is a schematic diagram showing one example of the present invention.
Figure 6:
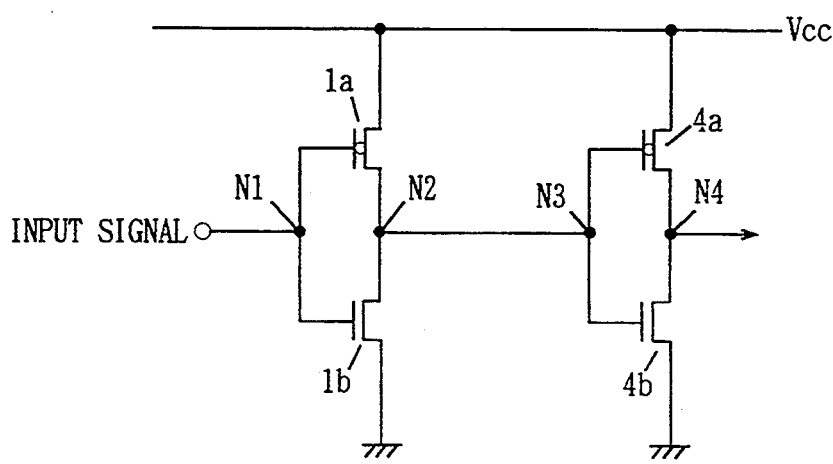
FIG. 6 is a schematic diagram of a conventional semiconductor integrated circuit device.

FIG. 1 is a schematic diagram showing one embodiment of the present invention. Referring to FIG. 1, the semiconductor integrated circuit device differs from the semiconductor integrated circuit device shown in FIG. 4 in that an N channel transistor $2b$ is provided in parallel to N channel transistor $1b$, and that a plurality of N channel transistors $3b$ connected in series are provided between the gate electrode of N channel transistor $2b$ and the supply voltage Vcc. A plurality of N channel transistors $3b$ constitute a voltage lowering circuit 3. Except these points, the device is the same as that of FIG. 6, and therefore the description thereof is not repeated.

Each of the plurality of N channel transistors $3b$ has its gate electrode and drain electrode connected to each other to form a diode. The N channel transistor $3b$ of the first stage has its drain electrode connected to the supply voltage Vcc, and its source electrode connected to the drain electrode of the N channel transistor $3b$ of the succeeding stage. The N channel transistor $3b$ of the last stage has its source electrode connected to the gate electrode of N channel transistor $2b$. In this manner, by providing a cascade connection of a plurality of diodes by means of a plurality of N channel transistor $3b$, a voltage $Vcc - X \cdot Vth$ is provided, by lowering the supply voltage Vcc to a desired potential. In this expression, the reference character X represents the number of the N channel transistor $3b$, and Vth represents the threshold voltage of the N channel transistor $3b$.

The relation between $Vcc - X \cdot Vth$ and the N channel transistor $2b$ will be described in detail. The number of stages X of the N channel transistor $3b$ is set such that $Vcc - XVth \geq Vth(2b)$ when the supply voltage Vcc is at the lower limit (4.5 v) of the allowable range of fluctuation, for example. Here $Vth(2b)$ represents the threshold voltage of the N channel transistor $2b$. By setting the number of stages X in this manner, the current supplying capability of the N channel transistor $2b$ can be controlled in correspondence with the fluctuation of the supply voltage, as the N channel transistor $2b$ can substantially be kept in the active state.

The ratio of the channel width sizes of the transistors $1a$, $1b$ and $2b$ are set as 4:2:1.

The operation of the semiconductor integrated circuit device shown in FIG. 1 will be described. By the diode connected plurality of N channel transistors $3b$, a voltage obtained by subtracting the threshold voltage $X \cdot Vth$ from the supply voltage Vcc is generated. The generated voltage is applied to the gate electrode of the N channel transistor $2b$. This voltage becomes higher when the supply voltage Vcc becomes higher, and it becomes lower when the supply voltage Vcc becomes lower. When a voltage which has attained high is applied to the gate electrode of the N channel transistor $2b$, the capability of supplying current of N channel transistor $2b$ is increased. Therefore, compared with the prior art example in which N channel transistor $1b$ is solely used, the amount of current flowing to the side of the N channel of the CMOS inverter increases. Consequently, the value $V_{IH}min$ becomes smaller, providing wider margin. On the contrary, when a voltage which is lowered is applied to the gate electrode of N channel transistor $2b$, the capability of supplying current of N channel transistor $2b$ is decreased. Consequently, P channel transistor $1a$ has higher capability of current supply the N channel transistor 2b. As a result, the value of $V_{IL}$max becomes higher, providing wider margin.

Figure 2:
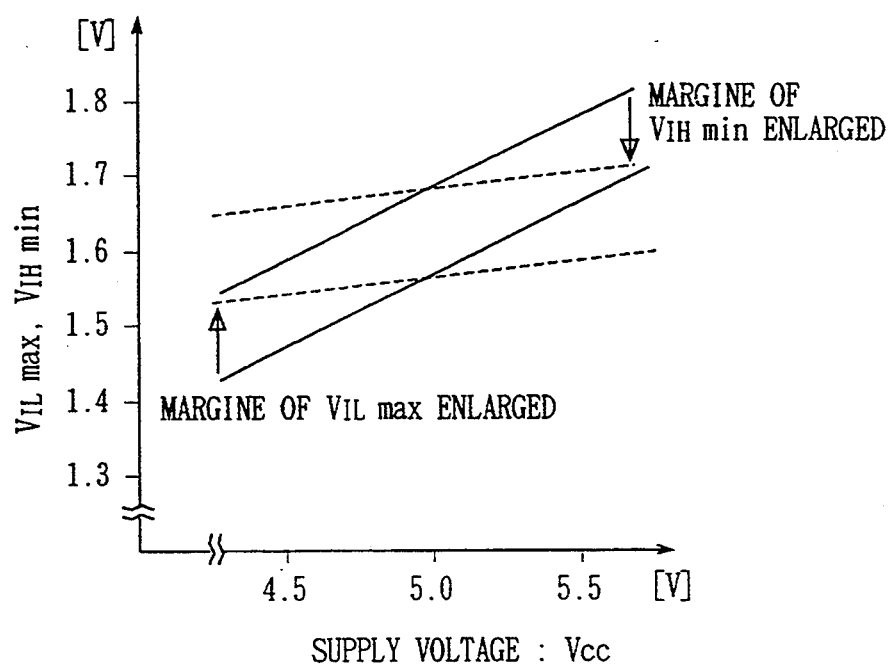
FIG. 2 is a graph showing dependency on supply voltage of $V_{IL}max$ and $V_{IH}min$ of the semiconductor integrated circuit devices shown in FIGS. 1 and 4.
Figure 5:
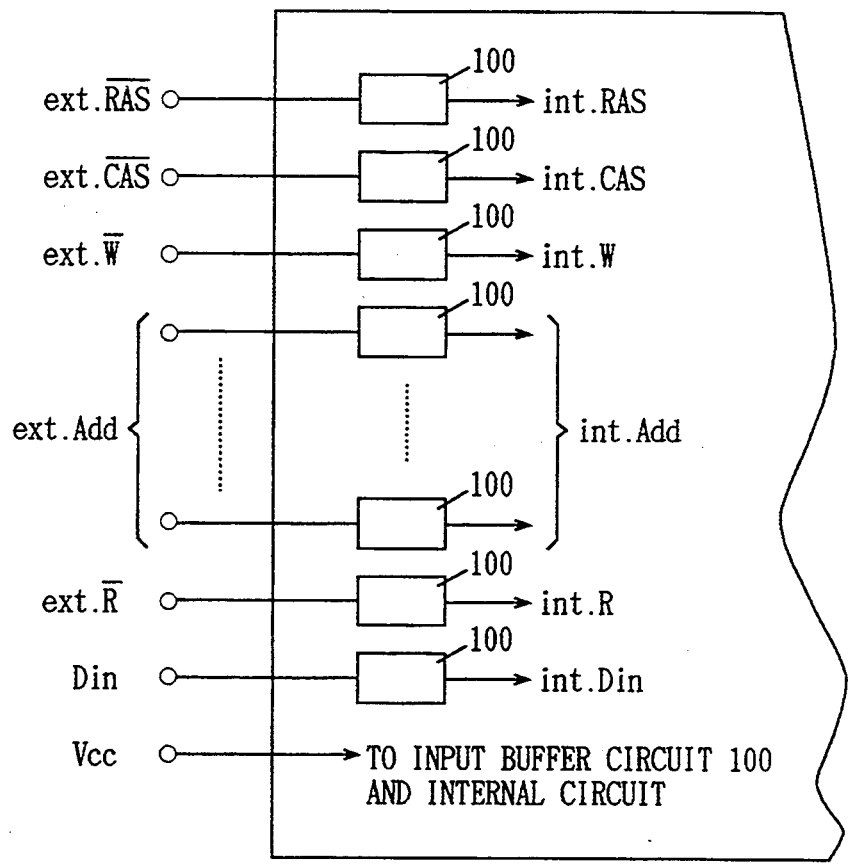
FIG. 5 is a block diagram showing a structure of an input portion of a DRAM for explaining the background of the present invention.

FIG. 2 is a graph showing dependency on supply voltage of the value $V_{IL}$max and $V_{IH}$min of the semiconductor integrated circuit devices shown in FIGS. 1 and 5. In FIG. 2, the solid lines denote the values $V_{IL}$max and $V_{IH}$min of the prior art (FIG. 6), and the dotted lines denote the values $V_{IL}$max and $V_{IH}$min of the present invention. The abscissa represents the supply voltage Vcc, while the ordinate represents the values $V_{IL}$max and $V_{IH}$min. As is apparent from FIGS. 2 and 3, inclination is smaller in the present invention, showing the fact that the dependency on supply voltage of the values $V_{IL}$max and $V_{IH}$min is smaller. The supply voltage Vcc is set in the range of 4.5–5.5 V, as it is determined as a specification that DRAMs and the like can operate at the voltage in this range.

Figure 3:
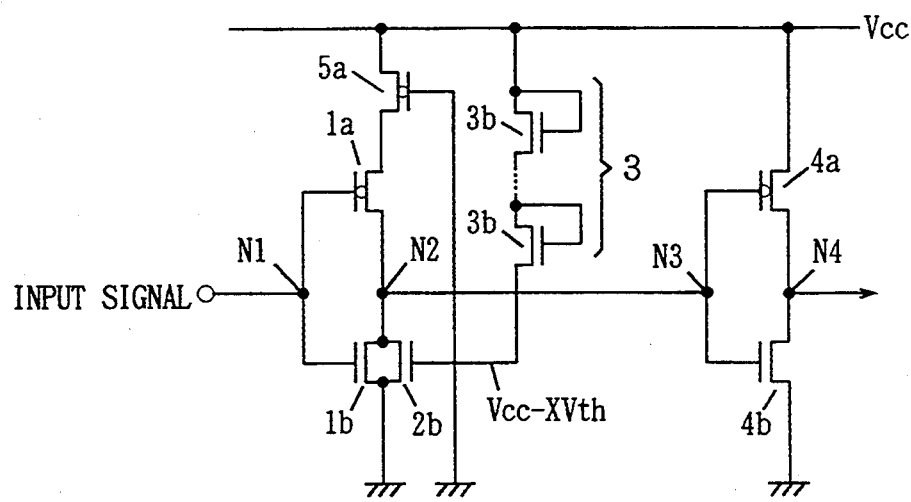
FIG. 3 is a schematic diagram showing another embodiment of the present invention.

FIG. 3 shows another example of the CMOS inverter according to another embodiment of the present invention. The CMOS inverter shown in FIG. 3 differs from the CMOS inverter of FIG. 1 in that a P channel transistor 5a is provided between the source electrode of the P channel transistor 1a and the supply terminal Vcc, and that the gate electrode of the P channel transistor 5a is connected to the ground potential.

In operation, the supply voltage Vcc is applied to the source electrode of the P channel transistor 1a through the P channel transistor 5a.

Figure 4:
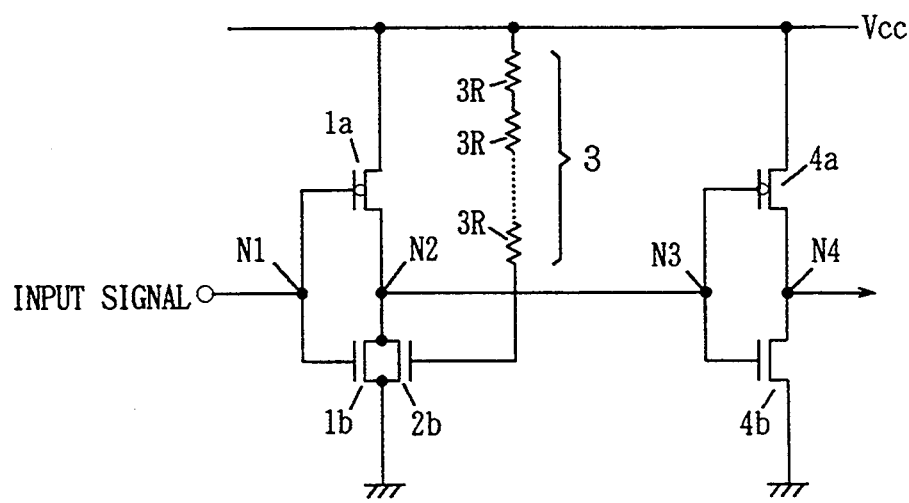
FIG. 4 is a schematic diagram showing a further embodiment of the present invention.

By applying the CMOS inverter shown in FIGS. 1, 3 and 4 to the input buffer circuit of the DRAM shown in FIG. 5, the operation margin can be enlarged as compared with the prior art. Therefore, even if the supply voltage Vcc fluctuates and the input signal includes noise, the range in which the DRAM can operate normally can be widened.

Although the supply voltage is lowered by a plurality of N channel transistor in the embodiment of FIG. 1, resistances may be used instead of the plurality of N channel transistors. An embodiment employing a resistor is shown in FIG. 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device including a CMOS inverter having first and second field effect elements of different types of conductivity, comprising:
   a third field effect element having the same conductivity type as said first field effect element and connected in parallel to said first field effect element, and
   control means generating a voltage provided by lowering a supply voltage by a prescribed potential and supplying the lowered supply voltage to said third field effect element for controlling in an analog manner, current supply capability of said third field effect element.

2. The semiconductor integrated circuit device according to claim 1, wherein said voltage provided by lowering the supply voltage by a selected prescribed potential brings said third field effect element substantially to an active state.

3. The semiconductor integrated circuit device according to claim 1, wherein
   said third field effect element includes two conduction terminals and one control terminal, said control terminal receiving the voltage generated by said control means.

4. The semiconductor integrated circuit device according to claim 3, wherein
   said control means includes voltage lowering means connected between a power supply terminal and the control terminal of said third field effect element.

5. The semiconductor integrated circuit device according to claim 4, wherein said voltage lowering means includes a field effect element, said field effect element having its control terminal and one conduction terminal commonly connected and the other conduction terminal connected to one conduction terminal of an adjacent one of the field effect elements.

6. The semiconductor integrated circuit device according to claim 4, wherein said voltage lowering means includes resistor means.

7. The semiconductor integrated circuit device according to claim 1 further including supply means for supplying said supply voltage to said third effect elements.

8. An input portion for a DRAM device including state control signal receiving means for receiving a signal for controlling state of storage, address signal receiving means for receiving an externally generated address signal, write control signal receiving means for receiving a write control signal, a read control signal receiving means for receiving an input data, wherein
   at least one of said state control signal receiving means, the address signal receiving means, the write control signal receiving means and the read control signal receiving means includes a CMOS inverter having first and second field effect elements of mutually opposite conductivity types, said input portion comprising:
   a third field effect element having the same conductivity type as said first field effect element and connected in parallel to said first field effect element, and
   control means, coupled between a supply voltage and a gate of said third field effect element, for generating a voltage provided by lowering the supply voltage by a prescribed potential for controlling in an analog manners, capability of current supply of said third field effect element using the generated voltage.

* * * * *